(12) United States Patent
Talledo

(10) Patent No.: US 11,398,417 B2
(45) Date of Patent: Jul. 26, 2022

(54) SEMICONDUCTOR PACKAGE HAVING DIE PAD WITH COOLING FINS

(71) Applicant: STMICROELECTRONICS, INC., Calamba (PH)

(72) Inventor: Jefferson Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 16/654,950

(22) Filed: Oct. 16, 2019

(65) Prior Publication Data

US 2020/0135625 A1 Apr. 30, 2020

Related U.S. Application Data

(60) Provisional application No. 62/752,784, filed on Oct. 30, 2018.

(51) Int. Cl.
*H01L 23/31* (2006.01)
*H01L 23/495* (2006.01)
(Continued)

(52) U.S. Cl.
CPC .... *H01L 23/49568* (2013.01); *H01L 21/4828* (2013.01); *H01L 21/4871* (2013.01);
(Continued)

(58) Field of Classification Search
CPC . H01L 21/4828; H01L 21/4871; H01L 21/56; H01L 21/561; H01L 21/565; H01L 23/495; H01L 23/49568; H01L 23/49513; H01L 23/49541; H01L 23/3128; H01L 24/32; H01L 24/48; H01L 24/73; H01L 24/83; H01L 24/85; H01L 24/92; H01L 24/97; H01L 21/48; H01L 21/4821; H01L 21/4842; H01L 21/568; H01L 23/00; H01L 23/28; H01L 3/3192; H01L 23/49596; H01L 23/49861; H01L 23/31; H01L 23/49531; H01L 23/49548; H01L 23/3107; H01L 23/49503; H01L 2224/32245; H01L 2224/48091; H01L 2224/48106;

(Continued)

(56) References Cited

U.S. PATENT DOCUMENTS 6,114,760 A 9/2000 Kim et al.
6,777,788 B1 * 8/2004 Wan ........................ H05K 3/341
257/676

(Continued)

*Primary Examiner* — Chuong A Luu
(74) *Attorney, Agent, or Firm* — Seed Intellectual Property Law Group LLP

(57) ABSTRACT

Embodiments of the present disclosure are directed to leadframe semiconductor packages having die pads with cooling fins. In at least one embodiment, the leadframe semiconductor package includes leads and a semiconductor die (or chip) coupled to a die pad with cooling fins. The cooling fins are defined by recesses formed in the die pad. The recesses extend into the die pad at a bottom surface of the semiconductor package, such that the bottom surfaces of the cooling fins of the die pad are flush or coplanar with a surface of the package body, such as an encapsulation material. Furthermore, bottom surfaces of the cooling fins of the die pad are flush or coplanar with exposed bottom surfaces of the leads.

19 Claims, 8 Drawing Sheets

(51) Int. Cl.
*H01L 23/00* (2006.01)
*H01L 21/48* (2006.01)
*H01L 21/56* (2006.01)

(52) U.S. Cl.
CPC .......... *H01L 21/561* (2013.01); *H01L 21/565* (2013.01); *H01L 23/3128* (2013.01); *H01L 23/49513* (2013.01); *H01L 23/49531* (2013.01); *H01L 23/49541* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 24/97* (2013.01); *H01L 2224/32245* (2013.01); *H01L 2224/48091* (2013.01); *H01L 2224/48106* (2013.01); *H01L 2224/48247* (2013.01); *H01L 2224/73265* (2013.01); *H01L 2224/92247* (2013.01)

(58) Field of Classification Search
CPC . H01L 2224/48247; H01L 2224/73265; H01L 2224/92247; H01L 2224/2919; H01L 2224/97; H01L 2224/29298; H01L 2224/83101; H01L 2224/45099; H01L 2924/14; H01L 2924/181; H01L 2924/1433; H01L 2924/1461; H01L 2924/18301; H01L 2924/00012; H01L 2924/00014; H01L 23/3114; H01L 23/3121; H01L 23/49589; H01L 23/49593; H01L 23/3192; H01L 23/3142; H01L 23/3157; H01L 21/566
USPC ........................................................ 257/675
See application file for complete search history.

(56) References Cited

U.S. PATENT DOCUMENTS

| | | | |
|---|---|---|---|
| 8,330,270 B1* | 12/2012 | Lin | H01L 23/49503 257/784 |
| 8,673,687 B1 | 3/2014 | Liu et al. | |
| 8,981,548 B2* | 3/2015 | Shim | H01L 23/49503 257/667 |
| 9,012,268 B2* | 4/2015 | Jaurigue | H01L 24/97 438/123 |
| 9,029,991 B2* | 5/2015 | Warren | H01L 24/97 257/676 |
| 2003/0006055 A1* | 1/2003 | Chien-Hung | H01L 23/49548 174/557 |
| 2007/0108565 A1 | 5/2007 | Shim et al. | |
| 2007/0132091 A1 | 6/2007 | Wu et al. | |
| 2007/0238205 A1 | 10/2007 | Bauer et al. | |
| 2008/0203546 A1* | 8/2008 | Maloney | H05K 3/341 257/666 |
| 2008/0258278 A1 | 10/2008 | Ramos et al. | |
| 2009/0026594 A1* | 1/2009 | Yee | H01L 21/4825 257/676 |
| 2010/0148329 A1 | 6/2010 | Golick et al. | |
| 2010/0224972 A1 | 9/2010 | Powell et al. | |
| 2010/0258934 A1* | 10/2010 | Chien | H01L 23/49582 257/690 |
| 2012/0061808 A1 | 3/2012 | Liao | |
| 2012/0241922 A1* | 9/2012 | Pagaila | H01L 24/97 257/659 |
| 2015/0162260 A1 | 6/2015 | Liao | |
| 2015/0270205 A1* | 9/2015 | Tollafield | H01L 23/49503 228/256 |
| 2017/0117208 A1* | 4/2017 | Kasztelan | H01L 23/49551 |

* cited by examiner

SEMICONDUCTOR PACKAGE HAVING DIE PAD WITH COOLING FINS

BACKGROUND

Technical Field

Embodiments are directed to semiconductor packages with a die pad having cooling fins and methods of making same.

Description of the Related Art

Leadframe type semiconductor packages often include a leadframe comprising a die pad and a plurality of leads. Typically, a semiconductor die is coupled to a surface of the die pad and electrically coupled to the leads by conductive elements. Leadless (or no lead) packages are often utilized in applications in which small package sizes are desired. In general, flat leadless packages provide a near chip scale encapsulated package that includes a planar leadframe. Lands, which are bottom surfaces of the leads, are flush with a bottom surface of the package body and, in many cases, side surfaces of the package body to provide electrical connection to another device or substrate, such as a printed circuit board (PCB). During operation a semiconductor chip or die within the semiconductor package produces a considerable amount of heat. It is desirable that semiconductor packages provide improved paths for dissipating the heat away from the packages.

BRIEF SUMMARY

Embodiments of the present disclosure are directed to leadframe semiconductor packages having die pads with cooling fins. In at least one embodiment, the leadframe semiconductor package includes leads and a semiconductor die (or chip) coupled to a die pad with cooling fins. The cooling fins are defined by recesses formed in the die pad. The recesses extend into the die pad at a bottom surface of the semiconductor package, such that the bottom surfaces of the cooling fins of the die pad are flush or coplanar with a surface of the package body, such as an encapsulation material. Furthermore, bottom surfaces of the cooling fins of the die pad are flush or coplanar with exposed bottom surfaces of the leads.

In one embodiment, the die pad and the leads are from a thicker leadframe than is typically used. For instance, the die pad and leads may have a thickness of between 0.25 millimeters to 0.5 millimeters. In one embodiment, the cooling fins extend up to 60% of the thickness of the die pad. The thicker die pad provides improved heat dissipation as well as anchoring in the encapsulation material, which may be a molding compound. Thus, along with improved heat dissipation, the integrity of the package is also improved.

In one embodiment, the leads may extend across an entire thickness of the package, such that surfaces of the leads are exposed at first and second opposing surfaces of the package. In that regard, the package may be coupled to another device, such as a PCB, at either of the first or second surfaces of the package.

At many embodiments, the semiconductor package is a flat no lead packages, such as quad flat no-lead (QFN) packages and dual flat no-lead (DFN) packages.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure.

In the following description, certain specific details are set forth in order to provide a thorough understanding of various aspects of the disclosed subject matter. However, the disclosed subject matter may be practiced without these specific details. In some instances, well-known structures, such as semiconductor integrated circuit devices, and well-known semiconductor processing disclosed have not been described in detail to avoid obscuring the descriptions of other aspects of the present disclosure.

Figure 1A:
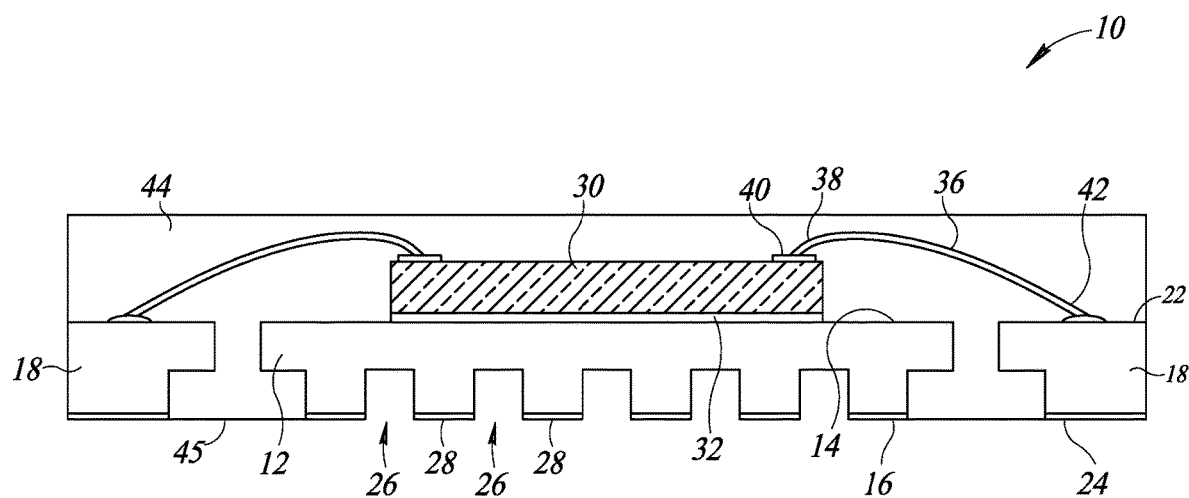
FIG. 1A is a schematic illustration of a cross-sectional view of a semiconductor package in accordance with one embodiment.
Figure 1B:
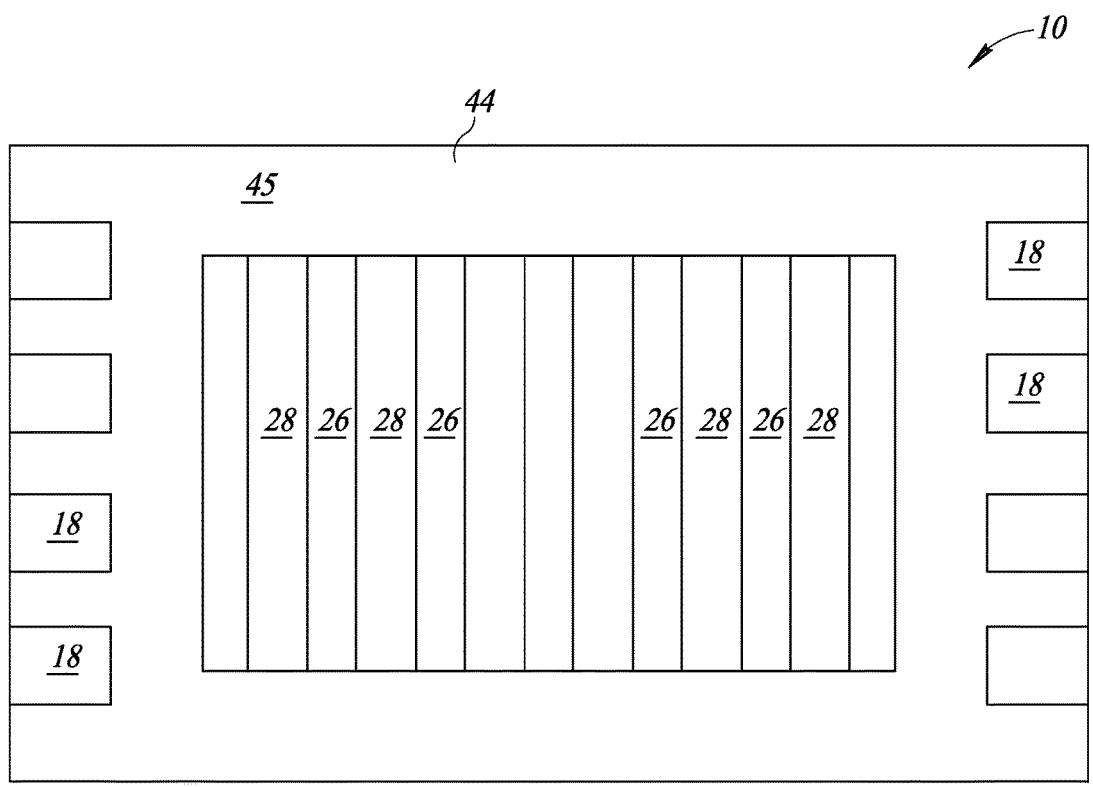
FIG. 1B is a bottom view of the package of FIG. 1A.

FIG. 1A shows a cross-sectional view of a leadframe semiconductor package 10 in accordance with one embodiment of the disclosure. The package 10 includes a die pad 12 and two leads 18 located on opposing sides of the die pad 12. FIG. 1B shows a bottom view of the package 10. As shown by the bottom view, the package 10 includes four leads 18 on opposing sides of the die pad 12. It is to be appreciated, however, that any number of leads may be included in the package including one lead on just one side of the die pad. In at least one embodiment, one or more leads are provided on four sides of the die pad.

With reference to FIG. 1A, the die pad 12 and the leads 18 have the same thickness as each other and are made from the same thermally conductive material, which may also be an electrically conductive material, such as copper or a copper alloy. The die pad 12 and the leads 18 may have a thickness that is greater than typical for leadframe thicknesses. In one embodiment, the die pad 12 and the leads 18 have a thickness that is twice the thickness of typical leadframes. For instance, the die pad 12 and the leads 18 may have a thickness in a range of 0.25 millimeters to 0.5 millimeters.

The die pad 12 has first and second surfaces 14, 16 and the leads 18 have first and second surfaces 22, 24. The first surface 14 of the die pad 12 is coplanar with the first surfaces 22 of the leads 18. Similarly, the second surface 16 of the die pad 12 is coplanar with the second surfaces 24 of the leads 18. The second surfaces 24 of the leads 18 may also be referred to as lands of the package 10.

A semiconductor die 30 that includes one or more electrical components, such as integrated circuits, is secured to the first surface 14 of the die pad 12 by an adhesive material 32. The semiconductor die 30 is made from a semiconductor material, such as silicon, and includes an upper active surface at which integrated circuits are formed as is well known in the art. The semiconductor die 30 may incorporate a microelectromechanical sensor (MEMS) device, an Application Specific Integrated Circuit (ASIC), or any other type of active structure. The adhesive material 32 may be any material configured to secure the semiconductor die 30 to the die pad 12, such as glue, paste, tape, and the like.

Conductive wires 36 electrically couple the semiconductor die 30 to the leads 18. For instance, a first end 38 of the conductive wire 36 is coupled to a bond pad 40 of the semiconductor die 30 and a second end 42 of the conductive wire 36 is coupled to a respective one of the leads 18. The conductive wires 36 provide electrical communication between circuits of the semiconductor die 30 and the leads 18.

Encapsulation material 44 is located over the first surface 14 of the die pad 12 and the first surfaces 22 of the leads 18 and covers the semiconductor die 30 and the conductive wires 36. The encapsulation material 44 is an insulating material that protects the electrical components of the semiconductor die and conductive wires from damage, such as corrosion, physical damage, moisture damage, or other causes of damage to electrical devices and materials. In some embodiments, the encapsulation material is at least one of a polymer, silicone, resin, polyimide, and epoxy.

The encapsulation material 44 is located between the leads 18 and the die pad 12 and forms a bottom surface 45 therebetween. The bottom surface 45 of the encapsulation material 44, along with the second surfaces 24 of the leads and the second surfaces 16 of the die pad 12, form an outer, bottom surface of the package. An upper surface of the encapsulation material 44 forms an outer, upper surface of the package 10. Side surfaces of the encapsulation material 44, along with side surfaces of the leads 18, form outer, side surfaces of the package 10.

The second surface 16 of the die pad 12 includes a plurality of recesses 26. The recesses 26 extend in to the thickness of the die pad 12 and form cooling fins 28 at the second surface 16 of the die pad 12. The recesses 26 may extend up to 50%, and in some embodiments up to 60%, of the thickness of the die pad 12. Thus, in the embodiment in which the die pad is 0.25 millimeters thick, the recesses have a depth that is 0.125 millimeters when the recess is 50% of the thickness of the die pad.

End surfaces of the cooling fins 28, which are also referred to as the second surface 16 of the die pad 12, remain flush or coplanar with a bottom surface of the package 10. The outer, bottom surface of the package 10 is formed by the end surfaces of the cooling fins 28, the bottom surface 45 of the encapsulation material 44, and the second surface 24 of the leads 18. Therefore, the end surfaces of the cooling fins 28, the bottom surface 45 of the encapsulation material 44, and the second surface 24 of the leads 18 are flush or coplanar with each other.

The recesses 26 that form the cooling fins 28 provide greater surface area of the die pad 12 being exposed to an external environment and thereby allow greater heat transfer of the die pad than a die pad without cooling fins. That is, the side surfaces and the bottom surface of the die pad 12 that form the recesses 26, as well as the ends of the cooling fins, are exposed to an environment that is external to the package 10 to improve the cooling of the package 10. In particular, heat produced by the semiconductor die 30 transfers to the die pad 12 and to the outside environment at the second surface 16 of the die pad 12 by the cooling fins 28.

Although the recesses 26 in FIG. 1A are rectangular shaped, the recesses 26 can have any configuration or shape. The recesses 26 are arranged alternatingly with each other as best shown in FIG. 1B. Although not shown, in one embodiment the die pad 12 extends to opposing sides of the package 10 such that the cooling fins 28 and the recesses 26 extend across the entire bottom surface of the package 10 and are exposed on side surfaces of the package 10. Thus, the cooling fins 28 and recesses 26 would also be exposed at opposing side surfaces of the package 10.

Figure 2A:
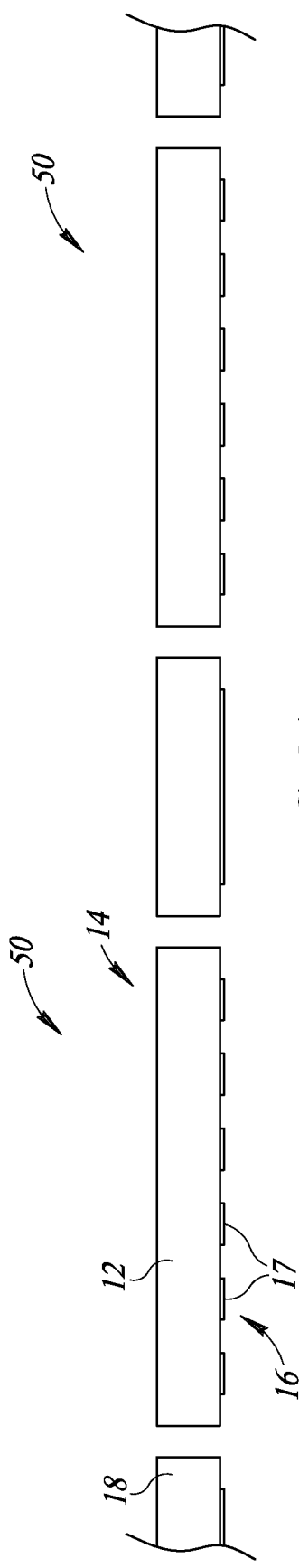
FIGS. 2A-2D are cross-sectional views illustrating stages of manufacturing the leadframe semiconductor package of FIGS. 1A and 1B in accordance with one embodiment.

FIGS. 2A-2D illustrate various stages of manufacturing the leadframe semiconductor package 10 of FIGS. 1A and 1B. As shown in FIG. 2A a portion of a leadframe strip 50 is provided. The leadframe strip 50 is a conductive material, such as metal, and in some embodiments is made of copper or a copper alloy. Leads and die pads may have been previously formed on the leadframe strip as shown in FIG. 2A as is well known in the art. Although only two sets of die pads and leads are shown, the leadframe strip 50 includes a plurality of die pads 12, leads 18, and connecting or tie bars (not shown) that are coupled together. The leadframe strip 50 may include die pads arranged in a single row or may include an array of die pads as is well known in the art.

Figure 2B:
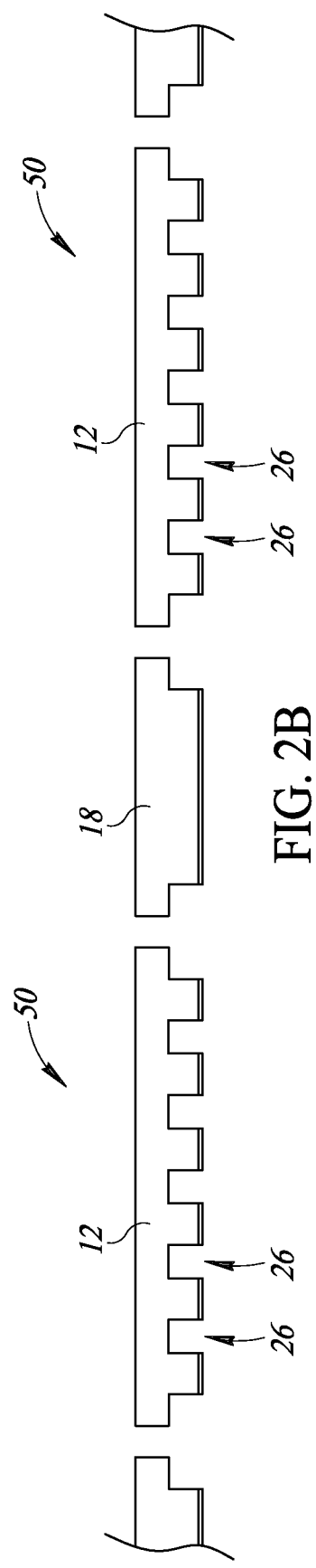

As shown in FIG. 2B, a conductive layer 17 is patterned onto the second surface 16 of the leadframe strip 50. The conductive layer 17 is patterned at locations that will form the second surface 16 of the die pad 12 and the second surfaces 24 of the leads 18. The conductive layer 17 is not formed at locations that will be later removed, such as by etching. Thus, the conductive layer 17 forms an etch pattern for a later etch step of the leadframe strip 50.

In one embodiment, the conductive layer is deposited, such as by plating techniques, on second surfaces 16 of the die pads 12 of the leadframe strip 50. The conductive layer 17 may include one or more conductive materials that are different materials from the leadframe strip itself. For instance, the conductive layer 17 may be one or more metal materials, such as Ni/Pd/Ag, Ni/Pd/Au—Ag alloy, or Ni/Pd/Au/Ag.

At the second surface 16 of the die pad 12, the recesses 26 and the cooling fins 28 are formed by removing portions of the leadframe strip 50 that are not covered by the conductive layer 17. In one embodiment, the recesses 26 are formed in an etch processing step, such as a wet etch, a dry etch, or a combination thereof, using standard semiconductor processing techniques. In that regard, the cooling fins 28 are also formed. As previously mentioned, the die pads 12 may be etched at the second surfaces 16 until at least 50%, or about 60%, of the total thickness of the die pads 12 has been reached. At the perimeter of the die pad and at portions of the leads, further recesses may be formed to aid in anchoring the die pad and leads in the encapsulation material.

Figure 2C:
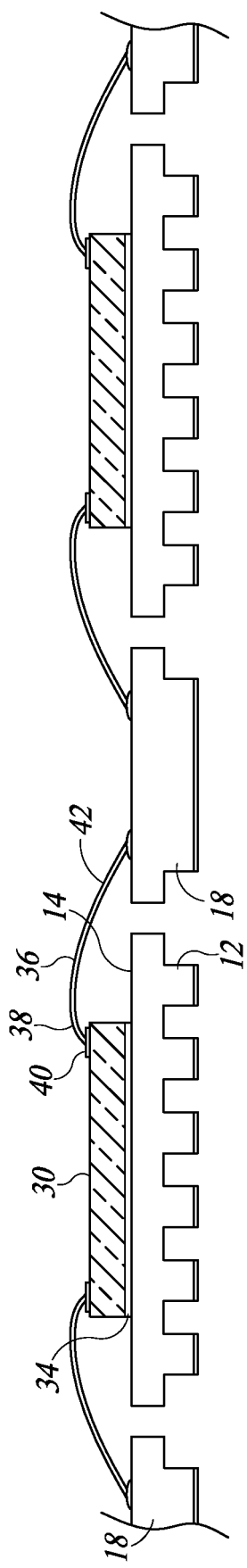

As shown in FIG. 2C, semiconductor dice 30 are placed on the first surfaces 14 of the die pads 12. In particular, the semiconductor dice 30 are secured to the die pads 12 by adhesive material 34, such as tape, paste, glue, or the like. The adhesive material 34 may be first coupled to the semiconductor dice 30, to the first surfaces 14 of the die pads 12, or both the dice and the die pads, prior to placing the semiconductor dice 30 on the first surfaces 14 of the die pads 12.

Each semiconductor dice 30 is electrically coupled to a respective set of leads 18. For instance, a first end 38 of a conductive wire 36 is coupled to a bond pad 40 of the semiconductor die 30 and a second end 42 of the conductive wire 36 is coupled to a surface of the lead 18 as is well known in the art.

Figure 2D:
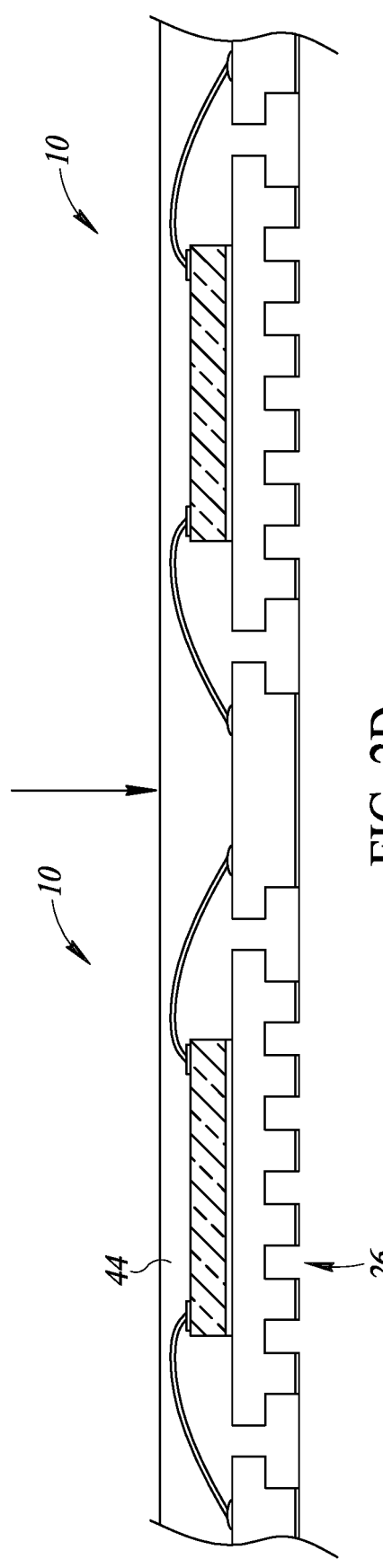

As shown in FIG. 2D, encapsulation material 44 is formed over the leadframe strip 50 so that the encapsulation material 44 surrounds the semiconductor die 30, the conductive wires 36, and first surfaces and side surfaces of the die pad 12 and the leads 18. The encapsulation material 44 may be formed by conventional techniques, for example by a molding process, and in some embodiments is hardened, which may involve a curing step. During molding the encapsulation material flows within the mold to fill the space between the leads and the die pad such that the leads, the die pad, and the encapsulation material forms a coplanar surface at a bottom surface of the package.

It is to be noted the encapsulation material 44 does not fill the recesses 26 of the die pads 12. Rather, the recesses 26 of the die pads 12 remain open such that the cooling fins 28 are exposed to an environment outside of the package to improve heat transfer away from the semiconductor die by the die pad. In that regard, the mold used to form the encapsulation material 44 is configured to prevent the encapsulation material 44 from filling the recesses 26.

The manufacturing process further includes separating each package into individual packages 10 by dicing at dicing streets as indicated by the arrow in FIG. 2D. The packages may be separated using any suitable dicing technique, such as by saw, laser etc. For instance, the packages may be separated using a saw blade that cuts through the encapsulation material and the leads 18.

It is to be appreciated that the method of making of the package may occur in another order than is shown and described. For example, the recesses 26 may be formed prior to forming the leads 18 and die pads 12 of the leadframe strip 50.

Figure 3:
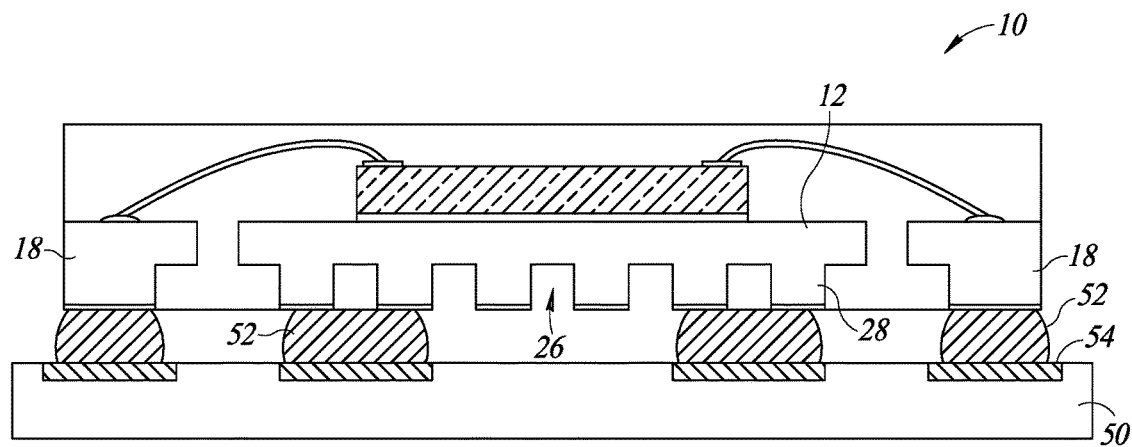
FIG. 3 is a schematic illustration of a cross-sectional view of the semiconductor package of FIG. 1A mounted to a printed circuit board (PCB).

FIG. 3 shows the package 10 attached to a printed circuit board (PCB) 50 by conductive elements 52, which may be solder balls. In particular, the conductive elements 52 are coupled between the leads 18 and conductive pads 54 of the PCB 50 and between the cooling fins 28 of the die pad 12 and conductive pads 54 of the PCB 50. The conductive elements 52 between the cooling fins 28 of the die pad 12 electrically couple the die pad 12 to the PCB 50. In some embodiments, the die pad 12 may be coupled to ground through the pads 54 of the PCB 50. The conductive elements 52 between the leads 18 and the conductive pads 54 of the PCB 50 electrically couple the semiconductor die of the package 10 to the PCB 50.

In one embodiment, portions of the perimeter of the die pad 12 are coupled to the pads 54 of the PCB 50. For instance, in the embodiments in which the die pad 12 is square or rectangular, the four corners of the perimeter of the die pad 12 may be coupled to respective pads 54 of the PCB 50 by the conductive elements 52. The conductive elements 52 may be of suitable size and shape such that that a space between the package 10 and the PCB 50 is 0.2 millimeters or more.

Although not shown, the PCB includes one or more layers of insulative materials and conductive materials, including conductive tracks, pads, and other features as is well known in the art. A fan (not shown) may be provided to further aid in the cooling of the package 10 by blowing air across the cooling fins 28.

As previously mentioned, the die pad 12 is thicker than typical die pads. The thicker die pad 12, along with the cooling fins 28, provides improved heat removal from the package 10.

Figure 4:
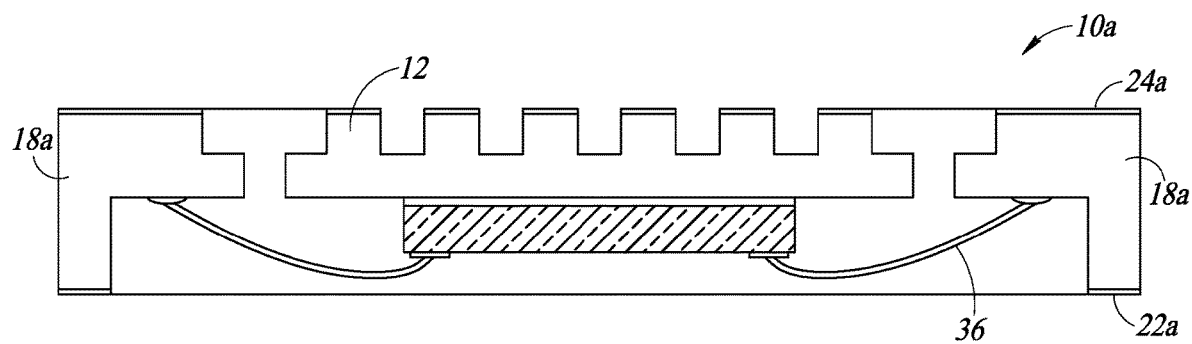
FIG. 4 is a schematic illustration of a cross-sectional view of a semiconductor package in accordance with another embodiment.

FIG. 4 shows a package 10a in accordance with another embodiment. Components of package 10a that are the same in structure and function with components of the package 10 of FIGS. 1A and 1B will have the same reference numbers and a corresponding description and, thus, will not be repeated again for the sake of brevity. Rather, only differences between packages 10 and 10a will be discussed below.

The package 10a of FIG. 4 includes leads 18a having portions that extend along the entire side surfaces of the package 10a such that first and second surfaces 22a, 24a are exposed on opposing sides of the package 10a. Thus, either the first surface 22a or the second surface 22a may be coupled to another component. Furthermore, both of the first and second surfaces 22a, 24a may be coupled to different components. As shown in FIG. 4, the leads 18a include a stepped feature that faces inward toward the die pad 12. The conductive wires 36 are coupled to surfaces of the leads 18a proximate the die pad 12.

Figure 5:
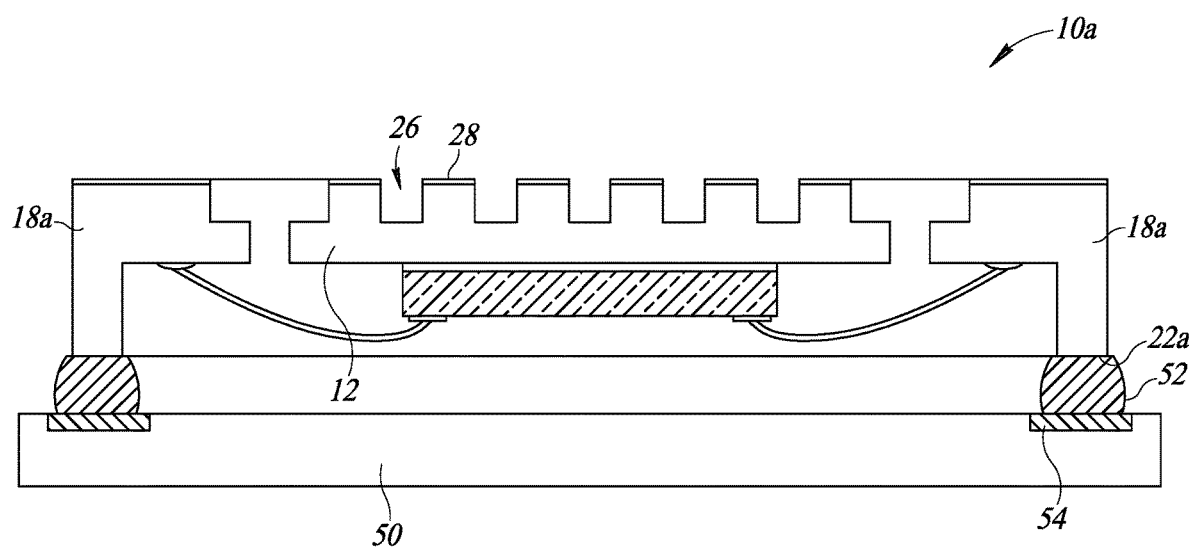
FIG. 5 is a schematic illustration of a cross-sectional view of the semiconductor package of FIG. 4 mounted to a PCB.

As shown in FIG. 5, the first surfaces 22a of the leads 18 are coupled to conductive pads 54 of the PCB 50 by conductive elements 52. Thus, the cooling fins 28 of the die pad 12 of the package 10a remain exposed and facing away from the PCB 50 such that thermal cooling of the die pad 12 may be greater than is provided with the package 10 in the arrangement of FIG. 3. In particular, a fan (not shown) may be placed above the package 10a to blow air directly on the cooling fins 28 of the die pad 12. Alternatively, the fan may be coupled to the PCB 50 or other components thereon to blow air across the cooling fins 28.

Although not shown, the package 10a may be stacked in the middle of two different components such that the first surfaces 22a of some of the leads 18a are coupled to a first component, while the second surfaces 24a of different ones of the leads 18a are coupled to a second, different component.

Figure 6A:
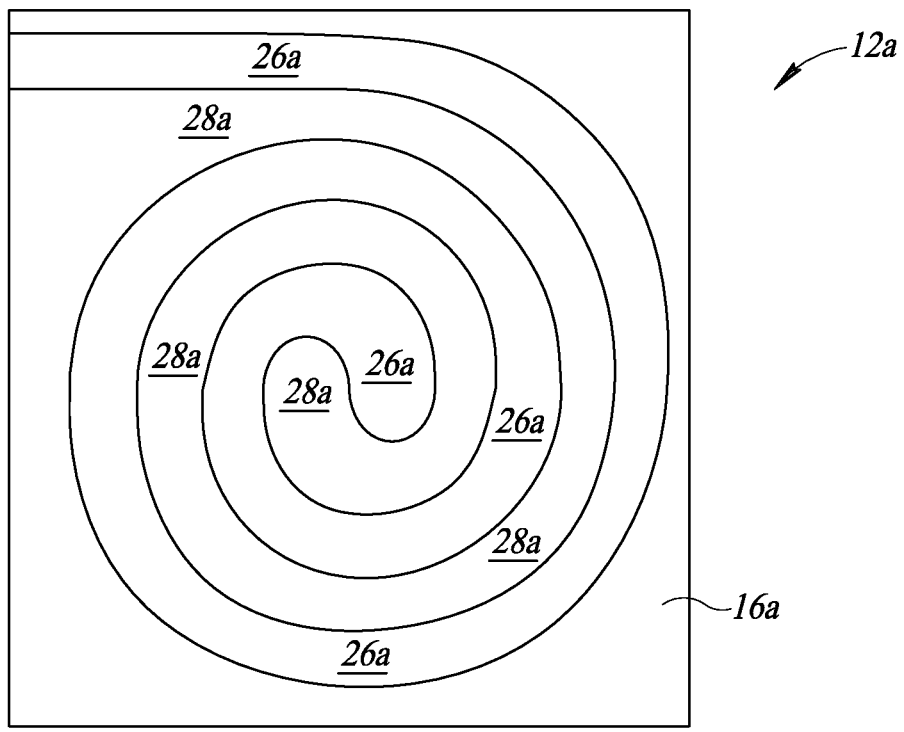
FIG. 6A shows a second surface of a die pad in accordance with another embodiment.
Figure 6B:
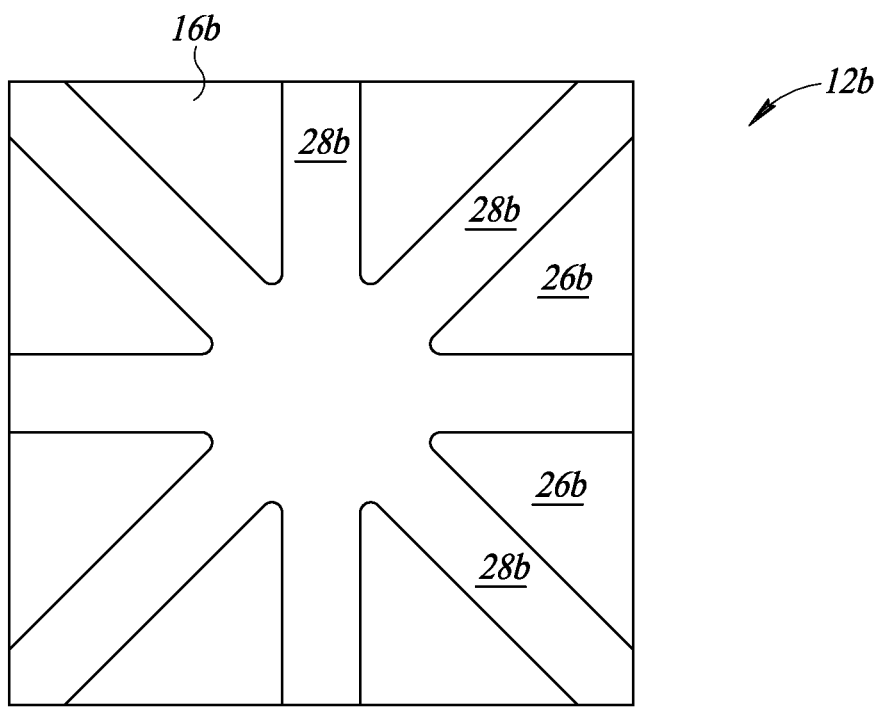
FIG. 6B shows a second surface of a die pad in accordance with yet another embodiment.

The shape of the cooling fins 28 of the die pad 12a may be different than shown in FIG. 1B. For instance as shown in FIG. 6A, a second surface 16a of the die pad 12a may include curved recesses, such as a single spiral recess 26a, which also forms a single spiral fin 28a. Alternatively, as shown in FIG. 6B, the cooling fins 28b of a second surface 16b of the die pad 12b may have a substantially radial arrangement formed by recesses 26b. Other arrangements for the cooling fins not shown may also be used.

Although the packages are shown as coupled to PCBs, in other embodiments the packages may be coupled to another package, device, or other substrate.

Furthermore, it is to be appreciated that by forming the packages described herein with thicker leadframes, the leads and the die pads provide improved anchoring in the encapsulation material than is provided by thinner leadframes. Thus, the integrity of the package is improved, along with the improved cooling effect. By integrating the cooling fins into the die pad of the package, the present disclosure reduces or eliminates the need for separate cooling devices, such as heat sinks, having to be coupled to the die pad of the package. Thus, there is no need for a thermal interface between the die pad and a separate heat sink.

FIGS. 7A-7E illustrate another method of making the package 10 of FIGS. 1A and 1B. The method shown in FIGS. 7A-7E includes similar steps or acts of FIGS. 2A-2D and thus any similarities will not be described in detail in the interest of brevity; rather, only differences will be described below.

Figure 7A:
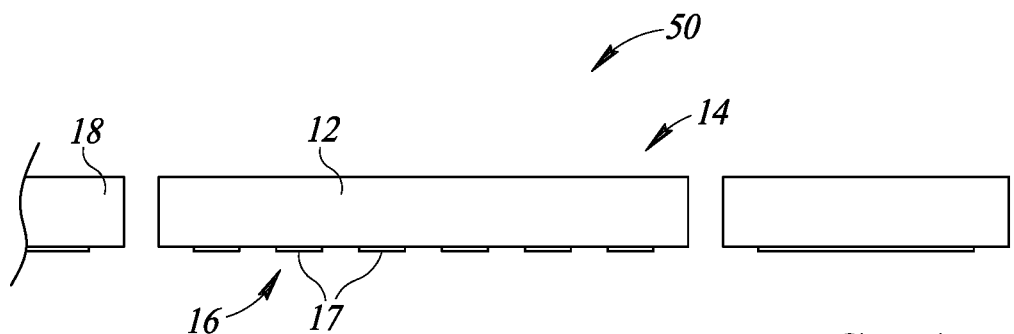
FIGS. 7A-7E are cross-sectional views illustrating stages of manufacturing the leadframe semiconductor package of FIGS. 1A and 1B in accordance with another embodiment.
Figure 7B:
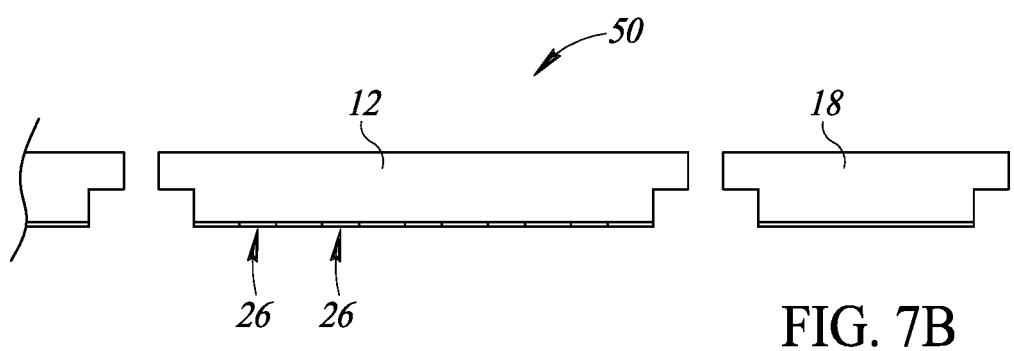

FIG. 7A shows the same initial leadframe strip 50 as provided in FIG. 2A. As shown in FIG. 7B, an etch pattern may be formed on the second surface of the die pad 12. The etch pattern may be any suitable material such as a light sensitive material like photo resist. The perimeter of the die pad 12 and portions of the leads 18 are then etched to form recesses that aid in anchoring the die pad and leads in the encapsulation material. In some embodiments, however, this step is skipped in view of the increased thickness of the die pad and the leads anchoring in the encapsulation material is significantly improved. Thus, the step of 7B, which involves both forming the etch pattern and etching the leads and die pad may be eliminated.

Figure 7C:
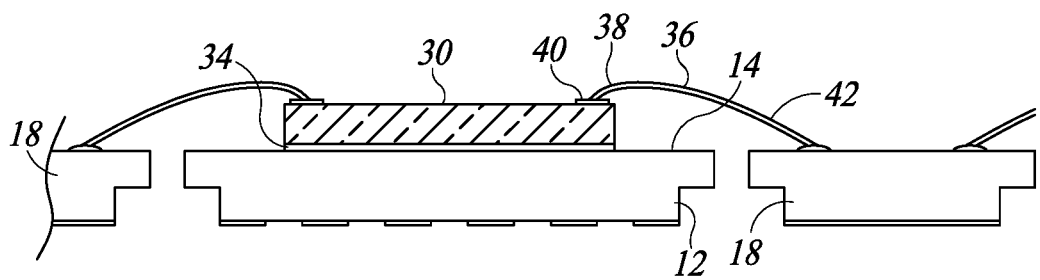

As shown in FIG. 7C, the etch pattern is removed. It is to be noted, however, that the etch pattern may be removed at a later step so long as the etch pattern is removed prior to forming the recesses as will be discussed below in FIG. 7E.

FIG. 7C also shows that the semiconductor die 30 is coupled to the die pad and electrically coupled to the leads 18 by the conductive wires 36 as described in detail above in reference to FIG. 2C. It is to be noted that the recesses have not yet been formed in the die pad 12.

Figure 7D:
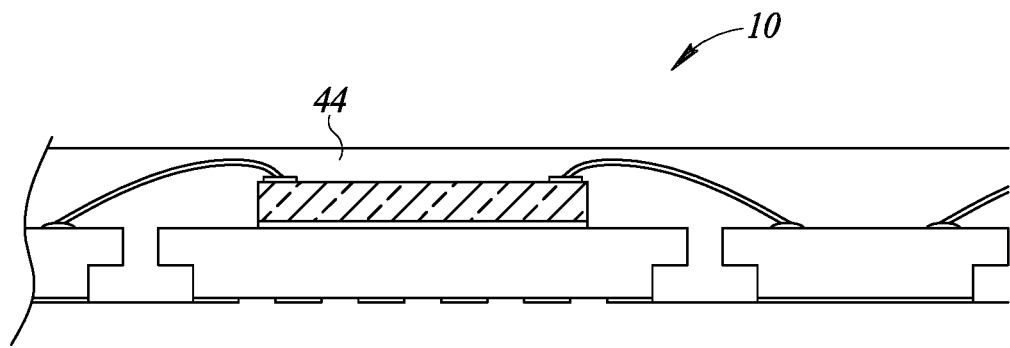

As shown in FIG. 7D the encapsulation material is formed in a molding step prior to the recesses being formed in the die pad. Thus, during the molding step the encapsulation material will not inadvertently get into the recesses.

Figure 7E:
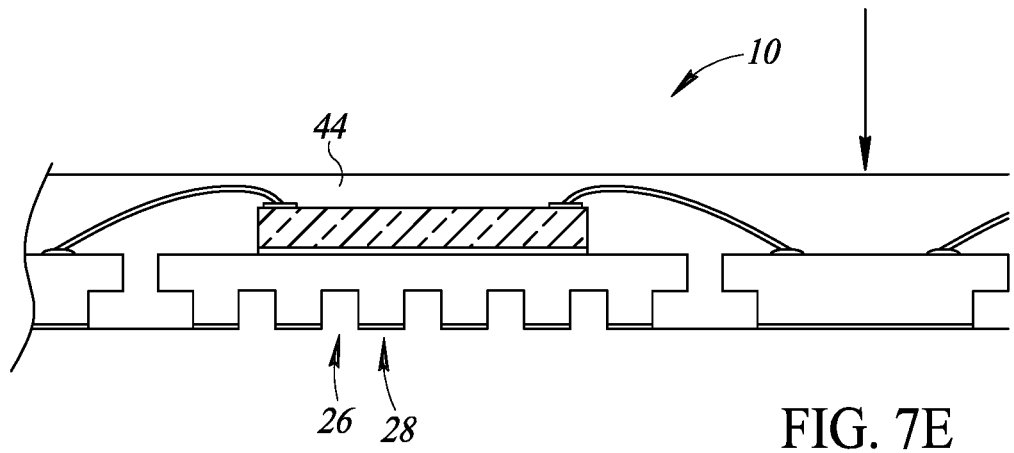

As shown in FIG. 7E, the recesses 26 in the die pad 12 are formed, thereby forming the cooling fins 28. As previously mentioned, by forming the recesses after the encapsulation step, the method prevents the encapsulation material from in advertently getting into the recesses 26, which could hinder the thermal properties of the die pad. The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
   a die pad having first and second opposing surfaces, the second surface of the die pad including a plurality of recesses and a plurality of cooling fins arranged in an alternating pattern such that each cooling fin of the plurality of cooling fins is arranged between adjacent recesses of the plurality of recesses, wherein each cooling fin of the plurality of cooling fins and each recess of the plurality of recesses extend across the second surface of the die pad from a first side to a second side, the second side being opposite the first side;
   a semiconductor die coupled to the first surface of the die pad;
   a plurality of leads;
   a plurality of conductive wires, the semiconductor die electrically coupled to the plurality of leads by the plurality of conductive wires, respectively; and
   encapsulation material over the first surface of the die pad, the semiconductor die, and the plurality of conductive wires,
   wherein an outer surface of the encapsulation material is flush with surfaces of the plurality of leads, and surfaces of the plurality of cooling fins to form a coplanar outer surface of the package.

2. The semiconductor package of claim 1, wherein the die pad has a thickness of at least 0.25 millimeters.

3. The semiconductor package of claim 2, wherein the plurality of leads have a same thickness as the die pad.

4. The semiconductor package of claim 1, wherein the recesses extend more than 50% through a thickness of the die pad.

5. The semiconductor package of claim 1, wherein the cooling fins and recesses are arranged in alternating columns at the second surface of the die pad.

6. The semiconductor package of claim 1, wherein the plurality of leads have first surfaces exposed at a first surface of the package and second surfaces exposed at a second surface of the package, wherein the first surface of the package opposes the second surface of the package.

7. The semiconductor package of claim 6, wherein the second surfaces of the plurality of leads are coupled to conductive pads of a PCB, wherein the cooling fins face away from the PCB.

8. The semiconductor package of claim 1, wherein the first surfaces of the plurality of leads are coupled to conductive pads of a PCB, wherein at least some of the cooling fins of the die pad are coupled to the PCB.

9. The semiconductor package of claim 8, wherein portions of the cooling fins at a perimeter of the die pad are coupled to the PCB.

10. An electronic device, comprising:
    a printed circuit board; and
    a semiconductor package coupled to the printed circuit board, the semiconductor package including:
       a die pad having first and second opposing surfaces, the second surface of the die pad including a plurality of recesses and a plurality of cooling fins arranged in an alternating pattern, wherein each cooling fin of the plurality of cooling fins and each recess of the plurality of recesses extend across the second surface of the die pad from a first side to a second side, the second side being opposite the first side;
       a semiconductor die coupled to the first surface of the die pad;
       a lead, the semiconductor die electrically coupled to the lead, wherein the lead comprises first and second surfaces, and the lead is electrically coupled to a conductive pad of a PCB, wherein the second surface and the first surface of the lead are on opposing sides; and
       encapsulation material covering the first surface of the die pad and the semiconductor die,
       wherein a surface of the encapsulation material is coplanar with the first surface of the lead, and a surface of the cooling fin to form an outer surface of the semiconductor package.

11. The electronic device of claim 10, wherein the plurality of cooling fins are formed by adjacent recesses of the plurality of recess, wherein the plurality of recesses extend at least 50% of a thickness of the die pad.

12. The electronic device of claim 10, wherein the die pad has a thickness of at least 0.25 millimeters.

13. A semiconductor package, comprising:
- a semiconductor die having a first surface and a second surface opposite the first surface;
- a die pad having a first surface and a second surface opposite the first surface, the second surface of the semiconductor die coupled to the first surface of the die pad, the second surface of the die pad including a plurality of recesses that extend at least 50% through a thickness of the die pad, the thickness of the die pad being delimited by the first and second surfaces of the die pad; and
- encapsulation material over the first surface of the semiconductor die, wherein a surface of the encapsulation material and the second surface of the die pad form a coplanar outer surface of the package.

14. The semiconductor package of claim 13, wherein the plurality of recesses are arranged in an alternating pattern such that respective cooling fins of the plurality of cooling fins are arranged between adjacent recesses of the plurality of recesses.

15. The semiconductor package of claim 14, wherein the plurality of recesses extend more than 50% through the thickness of the die pad.

16. The semiconductor package of claim 15, wherein the plurality of recesses are arranged in columns to form a plurality of cooling fins arranged in columns that alternate with the plurality of recesses.

17. The semiconductor package of claim 14, wherein the semiconductor package is coupled to a printed circuit board, wherein the plurality of cooling fins face away from the printed circuit board.

18. The semiconductor package of claim 13, wherein the die pad has a thickness of at least 0.25 millimeters.

19. The semiconductor package of claim 1, wherein the plurality of recesses and the plurality of cooling fins are arranged in an alternating pattern such that each cooling fin of the plurality of cooling fins is arranged between adjacent recesses of the plurality of recesses.

* * * * *

UNITED STATES PATENT AND TRADEMARK OFFICE
CERTIFICATE OF CORRECTION

PATENT NO. : 11,398,417 B2
APPLICATION NO. : 16/654950
DATED : July 26, 2022
INVENTOR(S) : Jefferson Talledo et al.

It is certified that error appears in the above-identified patent and that said Letters Patent is hereby corrected as shown below:

In the Claims

Column 9, Claim 13, Line 16:
"plurality of recesses that extend at least 50% through a" should read: -- plurality of fins and a plurality of recesses extending at least 50% through a --.

Column 9, Claim 13, Line 20:
"die pad; and" should read: -- die pad, wherein each fin of the plurality of fins extends linearly across the second surface of the die pad from a first side to a second side, the second side being opposite the first side; and --.

Signed and Sealed this
Twenty-seventh Day of September, 2022

Katherine Kelly Vidal
*Director of the United States Patent and Trademark Office*